US008864958B2

(12) United States Patent
Tilsch et al.

(10) Patent No.: US 8,864,958 B2
(45) Date of Patent: Oct. 21, 2014

(54) METHOD AND SPUTTER-DEPOSITION SYSTEM FOR DEPOSITING A LAYER COMPOSED OF A MIXTURE OF MATERIALS AND HAVING A PREDETERMINED REFRACTIVE INDEX

(75) Inventors: Markus K. Tilsch, Santa Rosa, CA (US); Joseph Smith, Petaluma, CA (US); Marius Grigonis, Santa Rosa, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 1347 days.

(21) Appl. No.: 12/041,959

(22) Filed: Mar. 4, 2008

(65) Prior Publication Data

US 2008/0223714 A1    Sep. 18, 2008

Related U.S. Application Data

(60) Provisional application No. 60/894,511, filed on Mar. 13, 2007.

(51) Int. Cl.
| | |
|---|---|
| *C23C 14/34* | (2006.01) |
| *C23C 14/54* | (2006.01) |
| *H01J 37/32* | (2006.01) |
| *C23C 14/52* | (2006.01) |
| *H01J 37/34* | (2006.01) |

(52) U.S. Cl.
CPC .............. *C23C 14/34* (2013.01); *C23C 14/54* (2013.01); *H01J 37/32935* (2013.01); *C23C 14/52* (2013.01); *H01J 37/34* (2013.01); *C23C 14/3492* (2013.01)
USPC ............. 204/192.26; 204/298.26; 204/298.08

(58) Field of Classification Search
USPC ............. 204/192.12, 298.03, 298.18, 298.08, 204/298.02, 298.27, 192.26, 192.27, 192.28
See application file for complete search history.

(56) References Cited

U.S. PATENT DOCUMENTS

| | | | |
|---|---|---|---|
| 3,502,562 A | 3/1970 | Humphries | ............ 204/298.12 |
| 3,962,062 A * | 6/1976 | Ingrey | ...................... 204/192.22 |

(Continued)

FOREIGN PATENT DOCUMENTS

| | | | |
|---|---|---|---|
| DE | 102005001554 | 7/2006 | ............ C03C 17/245 |
| EP | 1146139 | 10/2001 | ............. C23C 14/34 |
| WO | WO 98/37254 | 8/1998 | |

OTHER PUBLICATIONS

Laird and Belkind, "Cosputtered films of mixed $TiO_2/SiO_2$,", Journal of Vacuum Science and Technology A, 1992, vol. 10, pp. 1908-1912.

(Continued)

*Primary Examiner* — John Brayton
(74) *Attorney, Agent, or Firm* — JDS Uniphase Corporation

(57) ABSTRACT

A method and sputter-deposition system for depositing a layer composed of a mixture of materials and having a predetermined refractive index are provided. The sputter-deposition system includes a plurality of target cathodes, each of which comprises a target material having a different composition, that are powered by a single DC power supply. The plurality of target cathodes are cosputtered to deposit a layer composed of a mixture of materials on a substrate. The composite refractive index of the layer is controlled by adjusting an operating parameter of the plurality of target cathodes. Suitable operating parameters include cathode power, cathode voltage, cathode current, an angle between a cathode support and the substrate, and a flow rate of a reactive gas.

6 Claims, 7 Drawing Sheets

(56) References Cited

U.S. PATENT DOCUMENTS

| | | | |
|---|---|---|---|
| 4,252,626 A | 2/1981 | Wright et al. ............ 204/192.15 |
| 4,322,276 A * | 3/1982 | Meckel et al. ............ 204/192.26 |
| 4,468,313 A | 8/1984 | Okumura et al. ......... 204/298.12 |
| 4,505,798 A | 3/1985 | Ramachandran et al. ........................ 204/298.09 |
| 4,692,230 A | 9/1987 | Nihei et al. ............... 204/192.31 |
| 5,122,250 A * | 6/1992 | Doormann et al. ....... 204/192.26 |
| 5,225,057 A | 7/1993 | Lefebvre et al. ......... 204/192.13 |
| 5,354,575 A * | 10/1994 | Dagenais et al. ................ 427/10 |
| 5,525,199 A * | 6/1996 | Scobey .................... 204/192.26 |
| 5,667,919 A * | 9/1997 | Tu et al. ............................ 430/5 |
| 5,955,139 A * | 9/1999 | Iturralde ............................ 427/9 |
| 6,132,563 A | 10/2000 | Frach et al. .............. 204/192.13 |
| 6,217,719 B1 | 4/2001 | Kanazawa et al. ....... 204/192.12 |
| 6,506,289 B2 | 1/2003 | Demaray et al. ......... 204/192.26 |
| 6,585,871 B1 | 7/2003 | Anzaki et al. ............ 204/298.14 |
| 6,666,958 B1 | 12/2003 | Yoshikawa et al. ...... 204/192.23 |
| 6,679,976 B2 | 1/2004 | Baldwin et al. .......... 204/192.12 |
| 6,692,618 B2 * | 2/2004 | Dubs ........................ 204/192.12 |
| 6,736,943 B1 | 5/2004 | Scobey et al. ............ 204/192.12 |
| 6,800,183 B2 | 10/2004 | Takahashi ................ 204/298.28 |
| 6,863,785 B2 | 3/2005 | Shidoji et al. ............ 204/192.13 |
| 2003/0024807 A1 * | 2/2003 | Baldwin et al. .......... 204/192.12 |
| 2004/0182701 A1 | 9/2004 | Miyamura ................ 204/298.26 |
| 2004/0206620 A1 | 10/2004 | Wang et al. .............. 204/192.12 |
| 2005/0016834 A1 * | 1/2005 | Sawamura ............... 204/192.12 |
| 2006/0049041 A1 | 3/2006 | Ockenfuss et al. ....... 204/298.14 |
| 2006/0049042 A1 | 3/2006 | Tilsch et al. .............. 204/298.19 |
| 2006/0070877 A1 | 4/2006 | Tilsch et al. .............. 204/298.27 |
| 2007/0041087 A1 | 2/2007 | Kanaya .......................... 359/359 |
| 2008/0000768 A1 * | 1/2008 | Stimson et al. ............. 204/192.1 |

OTHER PUBLICATIONS

Search Report for EP Appln No. 08003989 dated May 10, 2010.

* cited by examiner

METHOD AND SPUTTER-DEPOSITION SYSTEM FOR DEPOSITING A LAYER COMPOSED OF A MIXTURE OF MATERIALS AND HAVING A PREDETERMINED REFRACTIVE INDEX

CROSS-REFERENCE TO RELATED APPLICATIONS

The present invention claims priority from U.S. Provisional Patent Application No. 60/894,511, filed Mar. 13, 2007, entitled "Control Of Thickness And Refractive Index In Thin Film Coatings" by Ockenfuss et al., which is incorporated herein by reference for all purposes.

TECHNICAL FIELD

The present invention relates to the deposition of thin films and, in particular, to the sputter deposition of layers composed of a mixture of materials and having a predetermined refractive index.

BACKGROUND OF THE INVENTION

Sputter deposition is a widely used technique for depositing thin films. In a typical sputter-deposition system, a power supply is used to apply a voltage to a target cathode, hereafter referred to as cathode voltage. The applied cathode voltage partially ionizes an inert gas in a vacuum chamber of the sputter-deposition system, creating a plasma. The plasma contains positively charged ions, which are attracted to the negatively charged target cathode and accelerate towards it. When the positive ions collide with the target cathode, target material is sputtered from the target cathode. The sputtered target material deposits as a layer on a substrate.

To expand the range of materials that can be deposited as a layer, a reactive gas, such as oxygen or nitrogen, can be introduced into the vacuum chamber of the sputter-deposition system. Such a reactive-sputtering technique produces a layer composed of a material, for example, an oxide or a nitride, that is derived from the target material by chemical reaction with the reactive gas.

For many applications, such as optical coatings and filters, thin films having one or multiple predetermined refractive indices are required. For example, it is advantageous for an antireflection coating to have a refractive index as close as possible to the value that minimizes reflection at an interface. For another example, a Rugate notch filter requires a plurality of refractive indices that vary continuously along the thickness of the filter. For such applications, the required refractive indices are often intermediate to those accessible by common sputtering techniques.

When a single target material is sputtered, the following approaches can be taken to deposit a layer having such an intermediate refractive index. In a first approach, the cathode power or the substrate temperature can be adjusted to vary the microstructure and, hence, the refractive index of the deposited layer, as described in U.S. Pat. No. 6,506,289 to Demaray, et al. and U.S. Pat. No. 6,666,958 to Yoshikawa, et al., for example. In a second approach, the composition of the single target material can be adjusted, for example, by doping, to vary the composition and, hence, the refractive index of the deposited layer, as described in U.S. Pat. No. 6,506,289 to Demaray, et al. In a third approach, when the single target material is sputtered in the presence of a reactive gas, the flow rate of the reactive gas can be adjusted to vary the composition and the refractive index of the deposited layer, as described in U.S. Pat. No. 6,506,289 to Demaray, et al. and U.S. Pat. No. 6,666,958 to Yoshikawa, et al. In a fourth approach, when a single target material is sputtered in the presence of a mixture of reactive gases, the ratio of the reactive gases can be adjusted to vary the composition and the refractive index of the deposited layer, as described in U.S. Pat. No. 6,217,719 to Kanazawa, et al., U.S. Pat. No. 6,506,289 to Demaray, et al., and World Patent Application No. WO 1998/37254 to Placido.

Alternatively, target materials having different compositions can be sputtered at the same time, i.e. cosputtered, to deposit a layer composed of a mixture of materials. The refractive index of the deposited layer, which is a composite of the refractive indices of the materials in the deposited layer, can be varied by adjusting the ratio of the materials in the deposited layer.

In a first cosputtering technique, a single target cathode including a plurality of regions, each of which comprises a target material having a different composition, is sputtered. Variations on this technique are described in U.S. Pat. No. 4,468,313 to Okumura, et al., U.S. Pat. No. 4,505,798 to Ramachandran, et al., and U.S. Pat. No. 6,692,618 to Dubs, for example. However, this cosputtering technique has the disadvantage that, in many instances, the fabrication of single target cathodes comprising a plurality of target materials is difficult or impossible.

In a second cosputtering technique, a plurality of target cathodes, each of which comprises a target material having a different composition, are simultaneously sputtered. Variations on this technique are described in U.S. Pat. No. 3,502,562 to Humphries, U.S. Pat. No. 4,252,626 to Wright, et al., and U.S. Pat. No. 6,800,183 to Takahashi, for example. This cosputtering technique allows layers composed of a mixture of materials to be deposited by using conventional target cathodes comprising single target materials.

When a plurality of target cathodes, each of which comprises a target material having a different composition, are cosputtered, the composition and the composite refractive index of the deposited layer can be adjusted by independently changing the cathode powers supplied to each of the target cathodes, as described in U.S. Pat. No. 5,225,057 to Lefebvre, et al., U.S. Patent Application Publication No. 2004/0182701 to Miyamura, and an article entitled "Cosputtered films of mixed $TiO_2/SiO_2$" by Laird and Belkind (Journal of Vacuum Science and Technology A, 1992, Vol. 10, pp. 1908-1912), for example. This approach has the disadvantage of requiring a sputter-deposition system in which each of the target cathodes is connected to a separate power supply.

When two target electrodes, each of which comprises a target material having a different composition, are sputtered using a single alternating-current (AC) power supply, the composite refractive index of the deposited layer can be adjusted by changing the AC voltage applied across the target electrodes, as described in U.S. Pat. No. 6,585,871 to Anzaki, et al. However, as only one target electrode is sputtered at a time in this approach, the rate at which layers can be deposited is relatively low.

An object of the present invention is to overcome the shortcomings of the prior art by providing a simple method and sputter-deposition system for depositing a layer composed of a mixture of materials and having a predetermined refractive index. The present invention has the advantage of operating a plurality of target cathodes, each of which comprises a target material having a different composition, with a single direct-current (DC) power supply. The use of a single DC power supply represents a great simplification over the conventional use of a plurality of power supplies.

The present invention also recognizes that, rather than by individually adjusting operating parameters of each target cathode, the composite refractive index of the deposited layer can be controlled by adjusting an operating parameter of the plurality of target cathodes. The operating parameter can be cathode power, cathode voltage, or cathode current. Alternatively, the operating parameter can be an angle between a cathode support and a substrate, or a flow rate of a reactive gas.

SUMMARY OF THE INVENTION

Accordingly, the present invention relates to a sputter-deposition system for depositing a layer composed of a mixture of materials and having a predetermined refractive index, comprising: a vacuum chamber; a DC power supply; a substrate in the vacuum chamber; a plurality of target cathodes in the vacuum chamber, wherein each target cathode comprises a target material having a different composition, wherein the plurality of target cathodes are powered by only the DC power supply, and wherein the plurality of target cathodes are configured to be cosputtered to deposit a layer composed of a mixture of materials on the substrate; and a controller configured to adjust an operating parameter of the plurality of target cathodes, such that the layer has the predetermined refractive index.

Another aspect of the present invention relates to a method for depositing a layer composed of a mixture of materials and having a predetermined refractive index, in a sputter-deposition system, comprising: providing a vacuum chamber; providing a DC power supply; providing a substrate in the vacuum chamber; providing a plurality of target cathodes in the vacuum chamber, wherein each target cathode comprises a target material having a different composition, and wherein the plurality of target cathodes are powered by only the DC power supply; cosputtering the plurality of target cathodes to deposit a layer composed of a mixture of materials on the substrate; and adjusting an operating parameter of the plurality of target cathodes, such that the layer has the predetermined refractive index.

Another aspect of the present invention relates to a sputter-deposition system for depositing a layer composed of a mixture of materials and having a composite refractive index, comprising: a vacuum chamber; a DC power supply; a substrate in the vacuum chamber; a plurality of target cathodes in the vacuum chamber, wherein each target cathode comprises a target material having a different composition, wherein the plurality of target cathodes are powered by only the DC power supply, and wherein the plurality of target cathodes are configured to be cosputtered to deposit a layer composed of a mixture of materials on the substrate; and a controller configured to adjust an operating parameter of the plurality of target cathodes, such that the layer has the composite refractive index.

Another aspect of the present invention relates to a method for depositing a layer composed of a mixture of materials and having a composite refractive index, in a sputter-deposition system, comprising: providing a vacuum chamber; providing a DC power supply; providing a substrate in the vacuum chamber; providing a plurality of target cathodes in the vacuum chamber, wherein each target cathode comprises a target material having a different composition, and wherein the plurality of target cathodes are powered by only the DC power supply; cosputtering the plurality of target cathodes to deposit a layer composed of a mixture of materials on the substrate; and adjusting an operating parameter of the plurality of target cathodes, such that the layer has the composite refractive index.

BRIEF DESCRIPTION OF THE DRAWINGS

The invention will be described in greater detail with reference to the accompanying drawings which represent preferred, exemplary embodiments thereof, wherein.

DETAILED DESCRIPTION

Figure 1:
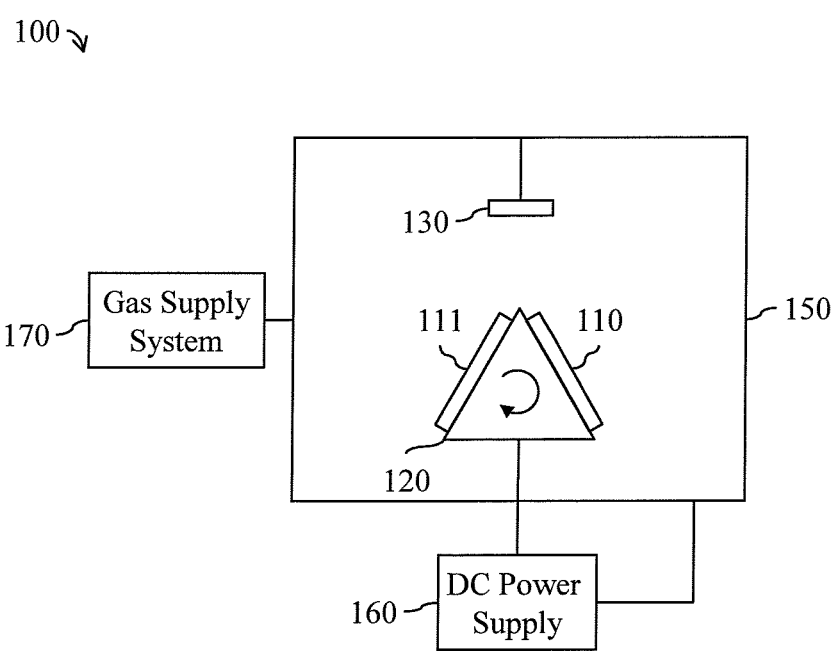
FIG. 1 is a schematic illustration of a sputter-deposition system for depositing a layer composed of a mixture of materials and having a predetermined refractive index.

The present invention provides a method and sputter-deposition system for depositing a layer composed of a mixture of materials and having a predetermined refractive index. With reference to FIG. 1, a preferred embodiment of the sputter-deposition system 100 includes a substrate 130 and a plurality of target cathodes 110 and 111, which are disposed on a cathode support 120, in a vacuum chamber 150. The plurality of target cathodes 110 and 111 are connected to a single DC power supply 160. The gas supply system 170 delivers gas into the vacuum chamber 150.

Each of the target cathodes 110 and 111 comprises a target material having a different composition. Preferably, each of the target cathodes 110 and 111 comprises a target material having a different refractive index. Preferably, each of the target cathodes 110 and 111 comprises an electrically conductive target material at one end surface. Suitable target materials include: metallic elements, such as titanium, niobium, tantalum, and aluminum; semiconducting elements, such as silicon and germanium; alloys, such as niobium/tantalum; and conductive oxides, such as $(In_2O_3)_{1-x}(SnO_2)_x$ (indium tin oxide (ITO)), $Ta_2O_{5-x}$, and $TiO_{2-x}$.

Preferably, the side surfaces of the target cathodes 110 and 111 are coated with an electrically insulating material, such as $Al_2O_3$ (alumina). Further details of such preferred target cathodes 110 and 111 are disclosed in U.S. Patent Application Publication No. 2006/0049042 to Tilsch, et al., which is owned by the assignee of the present invention and is incorporated herein by reference. Although the illustrated embodiment includes only two target cathodes 110 and 111, other embodiments may include additional target cathodes.

In a preferred embodiment, the plurality of target cathodes 110 and 111 are disposed on a cathode support 120, and an angle between the cathode support 120 and the substrate 130 can be adjusted. Preferably, the cathode support 120 can be rotated to adjust an angle between the cathode support 120 and the substrate 130. In the illustrated embodiment, two target cathodes 110 and 111 are disposed on two sides of a triangular cathode support 120, which can be rotated about an axis passing through the triangular center to a desired angle by an incorporated rotary drive, allowing the two target cathodes 110 and 111 to be accurately positioned relative to the substrate 130. In this instance, the angle is defined as a clockwise angle with respect to the centered position of the cathode support 120 shown in FIG. 1. Further details of such a preferred cathode support 120 are disclosed in U.S. Patent Application Publication No. 2006/0070877 to Tilsch, et al., which is owned by the assignee of the present invention and is incorporated herein by reference. Other embodiments may include a cathode support 120 with an alternative design.

An important feature of the present invention is that the plurality of target cathodes 110 and 111 are powered by only the DC power supply 160. The plurality of target cathodes 110 and 111 are connected in parallel to the negative lead of the DC power supply 160, and the anode is connected to the positive lead, in an electrical circuit. Thus, the DC power supply 160 simultaneously applies an identical cathode voltage, neglecting any cable losses, to each of the target cathodes 110 and 111.

Preferably, the plurality of target cathodes 110 and 111 are connected to the DC power supply 160 through a cathode switch. The negative lead from the DC power supply 160 is on one side of the cathode switch, and the leads from the plurality of target cathodes 110 and 111 are on the other side of the cathode switch. Relay switches between the leads allow the target cathodes 110 and 111 to be connected to the power supply 160. Accordingly, the cathode switch can be programmed to connect any combination of target cathodes 110 and 111 to the power supply 160. Alternatively, the plurality of target cathodes 110 and 111 may be connected to the DC power supply 160 through a firm connection.

The DC power supply 160 can be controlled to adjust the cathode power, cathode voltage, or cathode current. In a preferred embodiment, the DC power supply 160 is a pulsed DC power supply 160, which periodically applies a small reverse voltage for a short time to reduce charge buildup on the target cathodes 110 and 111 to prevent arcing. An example of such a preferred DC power supply 160 is the Pinnacle Plus power supply produced by Advanced Energy.

In a preferred embodiment, the walls of the vacuum chamber 150 serve as the anode. In another preferred embodiment, the anode is in the form of a vessel. Such a preferred anode is disclosed in U.S. Application Publication No. 2006/0049041 to Ockenfuss, et al., which is owned by the assignee of the present invention and is incorporated herein by reference. Other embodiments may include an anode with an alternative design.

In a preferred embodiment, the sputter-deposition system 100 includes a gas supply system 170, which provides the vacuum chamber 150 with a gas or a gas mixture via one or more mass flow controllers. Typically, the gas supply system 170 provides the vacuum chamber 150 with an inert gas, such as argon, at a typical flow rate of about 200 sccm. In some instances, the gas supply system 170 also introduces a reactive gas, such as oxygen or nitrogen, into the vacuum chamber 150 at a typical flow rate of about 100 sccm. Preferably, the gas supply system 170 can be controlled to adjust the flow rate of the reactive gas. During operation, the overall pressure in the vacuum chamber is typically about $1 \times 10^{-4}$ to $5 \times 10^{-4}$ Torr.

The gas or gas mixture is ionized by the cathode voltage applied to the plurality of target cathodes 110 and 111, producing a plasma. Positive ions of the plasma accelerate towards the target cathodes 110 and 111, and sputter the target materials. The sputtered target materials, or materials derived from the sputtered target materials by chemical reaction with a reactive gas, deposit as a layer on the substrate 130. The substrate 130 is, preferably, located opposite to the cathode support 120 in the vacuum chamber 150. Although the illustrated embodiment includes only one substrate 130, other embodiments may include additional substrates.

In a preferred embodiment, the substrate 130 is disposed on a substrate support, which is configured to move to uniformly expose the substrate 130 to each of the target cathodes 110 and 111. Preferably, a plurality of substrates 130 are disposed on a planetary substrate support. Further details of such a preferred substrate support are disclosed in U.S. Patent Application Publication No. 2006/0070877 to Tilsch, et al. Other embodiments may include a substrate support with an alternative design. For example, some embodiments may include a substrate support that can be rotated to adjust an angle between the cathode support 120 and the substrate 130.

Figure 2:
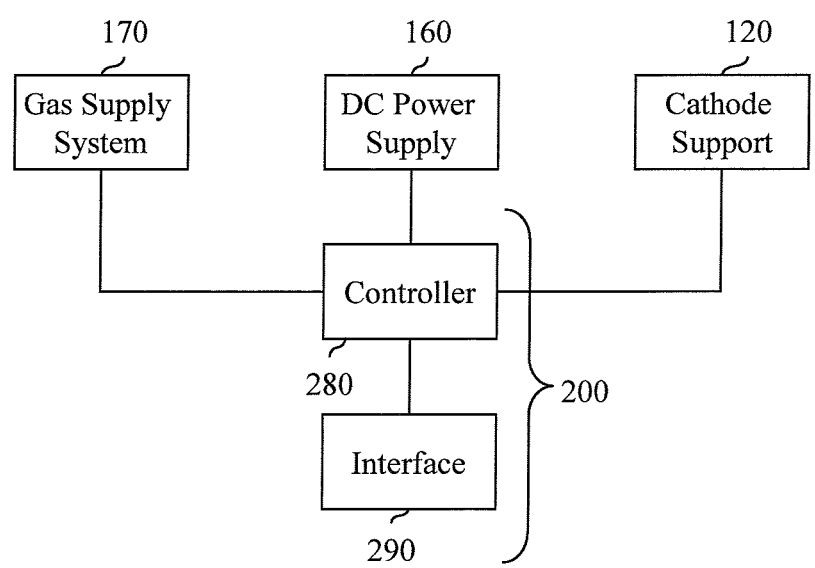
FIG. 2 is a block diagram of a control system of a sputter-deposition system for depositing a layer composed of a mixture of materials and having a predetermined refractive index.

With reference to FIG. 2, the sputter-deposition system 100 includes a control system 200 comprising a controller 280, which is, preferably, a programmable logic controller (PLC). In the illustrated embodiment, the DC power supply 160, the cathode support 120, and the gas supply system 170 are connected to the controller 280. The controller 280 may also be connected to other electromechanical systems of the sputter-deposition system 100.

The controller 280 is configured to adjust an operating parameter of the plurality of target cathodes 110 and 111, such that the layer deposited on the substrate 130 has a predetermined refractive index. In some embodiments, the operating parameter is cathode power, cathode voltage, or cathode current. In other embodiments including a cathode support 120, the operating parameter is an angle between the cathode support 120 and the substrate 130. In still other embodiments including a gas supply system 170, the operating parameter is a flow rate of a reactive gas. In some instances, more than one of these operating parameters may be adjusted to control the composite refractive index of the deposited layer.

Preferably, the sputter-deposition system 100 includes an ellipsometer configured to measure an actual refractive index of the deposited layer. In such an embodiment, the controller 280 is configured to adjust the operating parameter to ensure that the actual refractive index is substantially equivalent to the predetermined refractive index.

The controller 280 may be configured to adjust the operating parameter to have a substantially constant value, such that the layer has a homogeneous composition and a single predetermined refractive index, or to have a plurality of values, such that the layer has a plurality of compositions and a plurality of predetermined refractive indices along a thickness of the layer. In some instances, the controller 280 is configured to adjust the operating parameter to have a plurality of effectively continuous values, such that the layer has a plurality of compositions and a plurality of predetermined refractive indices that vary continuously along the thickness of the layer.

In a preferred embodiment, the control system 200 includes an interface 290, which is, preferably, a human-machine interface (HMI), for providing a reference value of the operating parameter to the controller 280. The controller 280 then directs the DC power supply 160, cathode support 120, or gas supply system 170 to adjust the operating parameter to have the reference value.

Preferably, the interface 290 is a personal computer provided with a program having a graphical user interface (GUI).

The program allows a user to input reference values of the operating parameter, individually or as a sequence. Preferably, the program also allows a user to control other aspects of the sputter-deposition system 100. For example, the program may allow the user to set operating parameters of other electromechanical systems of the sputter-deposition system 100, to monitor such operating parameters, to program a cathode switch to connect the plurality of target cathodes 110 and 111 to the DC power supply 160, to input a deposition time, and to turn the DC power supply 160 on and off. Such commands may be entered manually or may be carried out automatically according to a predetermined sequence.

In some instances, the interface 290 is also configured to determine the reference value of the operating parameter required to achieve a predetermined refractive index, on the basis of a dependence relationship of refractive index on the operating parameter. Preferably, the program on the personal computer allows the user to input a predetermined refractive index or a sequence of predetermined refractive indices, which are then converted by the program into a reference value or a sequence of reference values of the operating parameter.

Other embodiments may include a control system 200 with an alternative architecture. For example, in some embodiments, the controller 280 may be integrated with the interface 290, as a controller program loaded on a personal computer.

As will be evident to those skilled in the art, other embodiments of the sputter-deposition system 100 may have a different arrangement of the specified components and may include supplementary components.

With such a sputter-deposition system 100, a layer composed of a mixture of materials and having a predetermined refractive index can be deposited according to a method provided by the present invention.

The plurality of target cathodes 110 and 111, each of which comprise a target material having a different composition, are cosputtered to deposit a layer composed of a mixture of materials on the substrate 130. Preferably, the user initiates the cosputtering via the interface 290, which delivers the command to the controller 280. The controller 280 then turns on the DC power supply 160, which applies an identical cathode voltage to each of the target cathodes 110 and 111. Preferably, the substrate 130 is disposed on a substrate support, which is moved to uniformly expose the substrate 130 to each of the target cathodes 110 and 111.

When only an inert gas is present in the vacuum chamber 150, the layer deposited on the substrate 130 is substantially composed of a mixture of the target materials. When a reactive gas is introduced into the vacuum chamber 150, in addition to the inert gas, the deposited layer is substantially composed of a mixture of materials formed by chemical reaction between the target materials and the reactive gas. For example, when a target cathode 110 comprising silicon and a target cathode 111 comprising tantalum are cosputtered in the presence of oxygen as a reactive gas, the deposited layer is substantially composed of a mixture of $SiO_2$ and $Ta_2O_5$.

The refractive index of the deposited layer is a composite of the refractive indices of the materials in the deposited layer. Thus, the relative amounts of the different materials derived from the target materials in the deposited layer determine the composite refractive index of the deposited layer. For example, a deposited layer that is substantially composed of a mixture of $SiO_2$, which has a refractive index of about 1.48 (at 400 nm), and $Ta_2O_5$, which has a refractive index of about 2.27 (at 400 nm), will have a composite refractive index that is intermediate to these values.

The sputtering rates of the target materials from the target cathodes 110 and 111, and the related deposition rates of the materials derived from the target materials on the substrate 130 are influenced by a number of factors, including characteristics of the target materials and the plasma, as well as operating parameters of the plurality of target cathodes 110 and 111. Therefore, the relative amounts of the materials derived from each target material in the deposited layer and, hence, the composite refractive index of the deposited layer can be controlled by adjusting an operating parameter of the plurality of target cathodes 110 and 111.

As mentioned heretofore, suitable operating parameters include cathode power, cathode voltage, and cathode current. When the target cathodes 110 and 111 are disposed on a cathode support 120, the operating parameter may be an angle between the cathode support 120 and the substrate 130. When a reactive gas is introduced into the vacuum chamber 150, the operating parameter may be a flow rate of the reactive gas.

In some instances, the operating parameter is adjusted to have a substantially constant value during the deposition, such that a layer having a homogeneous composition and a single predetermined refractive index is deposited. Preferably, the user provides a reference value of the operating parameter via the interface 290, which communicates this value to the controller 280. The controller 280 then directs the DC power supply 160, cathode support 120, or gas supply system 170 to adjust the operating parameter to have the reference value.

For example, according to an embodiment having cathode power as the operating parameter, layers composed of a mixture of $SiO_2$ and $Ta_2O_5$ were deposited by cosputtering a target cathode 110 comprising silicon and a target cathode 111 comprising tantalum, in the presence of oxygen as a reactive gas, at different settings of cathode power. The cathode support 120 was kept in the centered position shown in FIG. 1, and the oxygen flow rate was maintained at 110 sccm. The refractive indices (at 400 nm) of the deposited layers are plotted against cathode power in FIG. 3. As cathode power increases, the deposition rate of $Ta_2O_5$ increases relative to that of $SiO_2$, and the composite refractive index of the deposited layer increases.

For another example, according to an embodiment having an angle between the cathode support 120 and the substrate 130 as the operating parameter, layers composed of a mixture of $SiO_2$ and $Ta_2O_5$ were deposited by cosputtering a target cathode 110 comprising silicon and a target cathode 111 comprising tantalum, in the presence of oxygen as a reactive gas, at different angles of the cathode support 120 from the centered position shown in FIG. 1. The cathode power was set at 8 kW, and the oxygen flow rate was maintained at 110 sccm. The refractive indices (at 400 nm) of the deposited layers are plotted against angle between the cathode support 120 and the substrate 130 in FIG. 4. As the angle increases, the target cathode 111 comprising tantalum approaches a horizontal orientation with respect to the substrate 130, whereas the target cathode 110 comprising silicon approaches a vertical orientation. Thus, as the angle of the cathode support 120 increases, the deposition rate of $Ta_2O_5$ increases relative to that of $SiO_2$, and the composite refractive index of the deposited layer increases.

For another example, according to an embodiment having a flow rate of a reactive gas as the operating parameter, layers composed of a mixture of $SiO_2$ and $Ta_2O_5$ were deposited by cosputtering a target cathode 110 comprising silicon and a target cathode 111 comprising tantalum, in the presence of oxygen as a reactive gas, at different oxygen flow rates. The cathode power was set at 8 kW, and the cathode support 120 was kept in the centered position shown in FIG. 1. The refractive indices (at 400 nm) of the deposited layers are plotted against oxygen flow rate in FIG. 5. As the oxygen flow rate increases, the deposition rate of $Ta_2O_5$ decreases relative to that of $SiO_2$, and the composite refractive index of the deposited layer decreases.

Alternatively, the operating parameter may be adjusted to have a plurality of values during the deposition, such that a layer having a plurality of compositions and a plurality of predetermined refractive indices along its thickness is deposited. Preferably, the user provides a sequence of reference values of the operating parameter via the interface 290, which communicates this sequence to the controller 280. The controller 280 then directs the DC power supply 160, cathode support 120, or gas supply system 170 to adjust the operating parameter to have the sequence of reference values.

Figure 6:
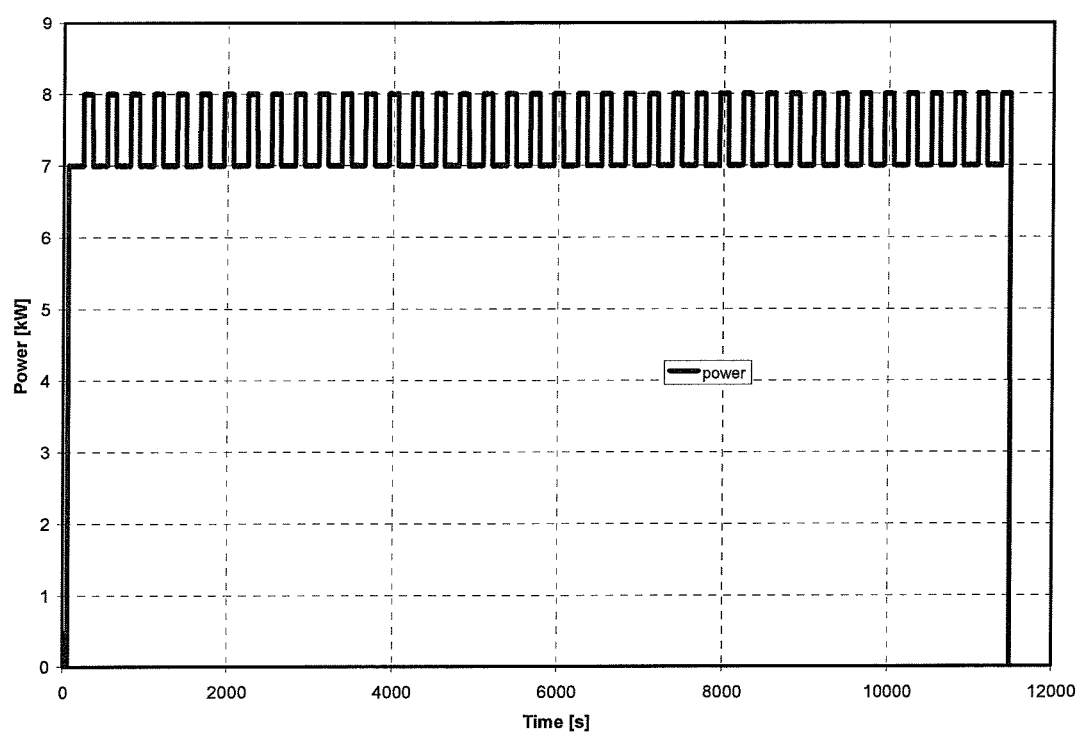
FIG. 6 is a plot of cathode power against time for a deposition of a layer composed of a mixture of $SiO_2$ and $Ta_2O_5$.
Figure 7:
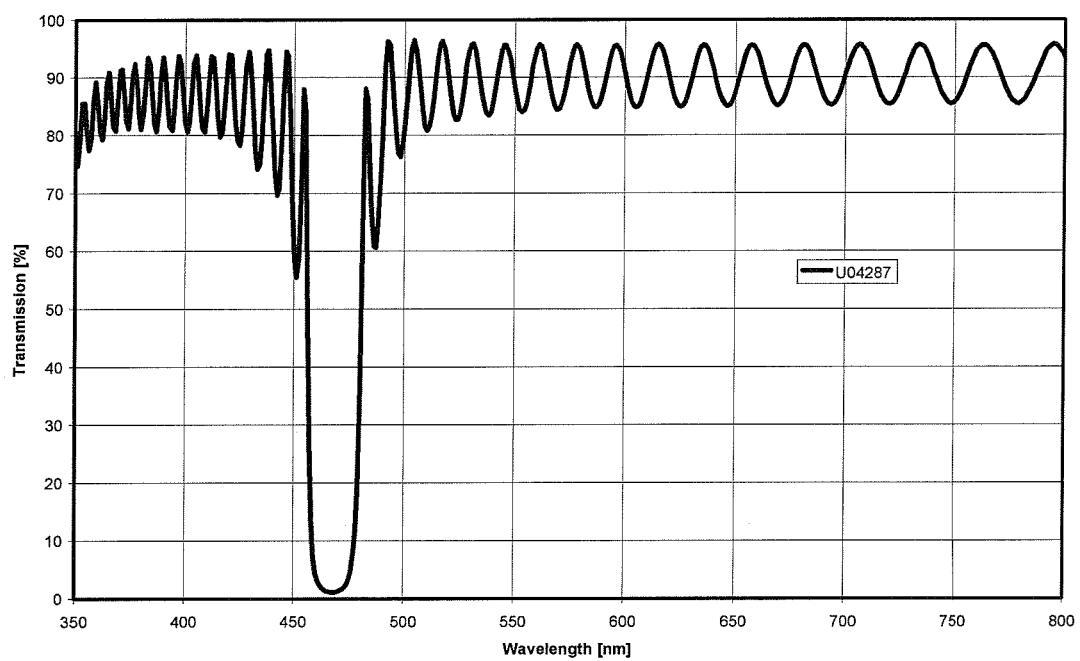
FIG. 7 is a transmission spectrum for a deposited layer composed of a mixture of $SiO_2$ and $Ta_2O_5$ and having two composite refractive indices that alternate along the thickness of the layer.

For example, according to an embodiment having cathode power as the operating parameter, a layer composed of a mixture of $SiO_2$ and $Ta_2O_5$ was deposited by cosputtering a target cathode 110 comprising silicon and a target cathode 111, in the presence of oxygen as a reactive gas, while oscillating cathode power between two settings. A plot of cathode power against time is presented in FIG. 6. The deposited layer has two compositions, each consisting of a different ratio of $SiO_2$ and $Ta_2O_5$, which alternate along the thickness of the layer. Accordingly, the deposited layer has two composite refractive indices, which alternate along the thickness of the layer. The transmission spectrum of the deposited layer, which can serve as a notch filter, is presented in FIG. 7.

In some instances, the operating parameter may be adjusted to have a plurality of effectively continuous values, such that the deposited layer has a plurality of compositions and a plurality of predetermined refractive indices that vary continuously along its thickness. For example, a Rugate notch filter can be produced according to such an embodiment.

Figure 3:
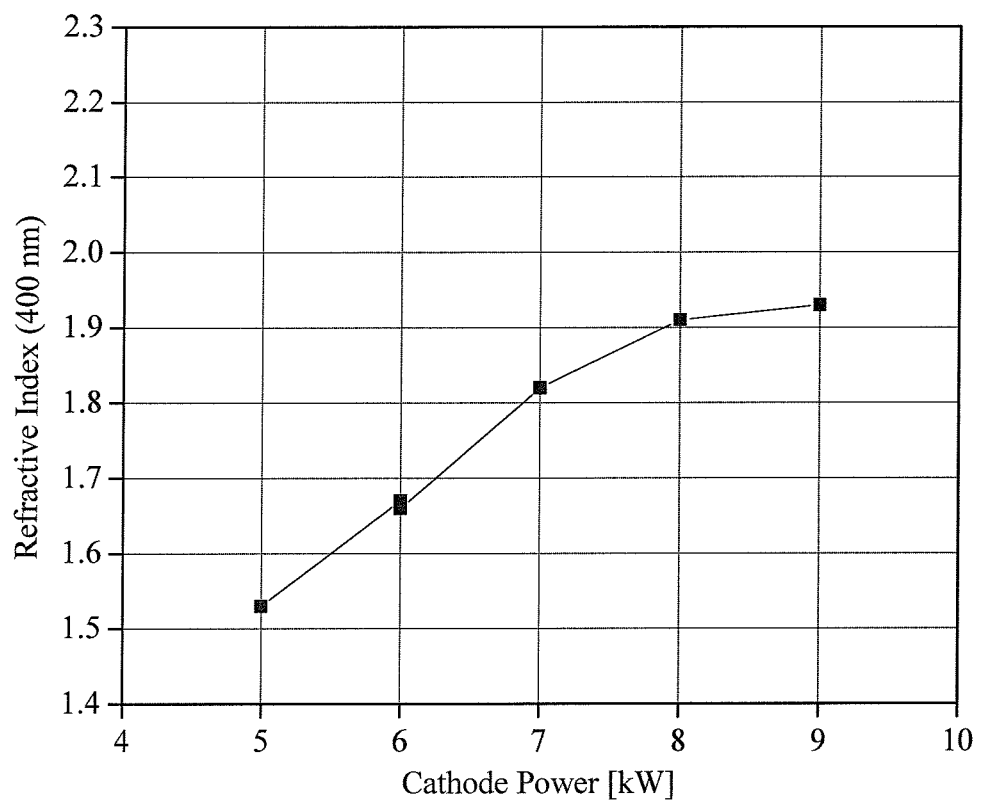
FIG. 3 is a plot of refractive index against cathode power for deposited layers composed of a mixture of $SiO_2$ and $Ta_2O_5$.
Figure 4:
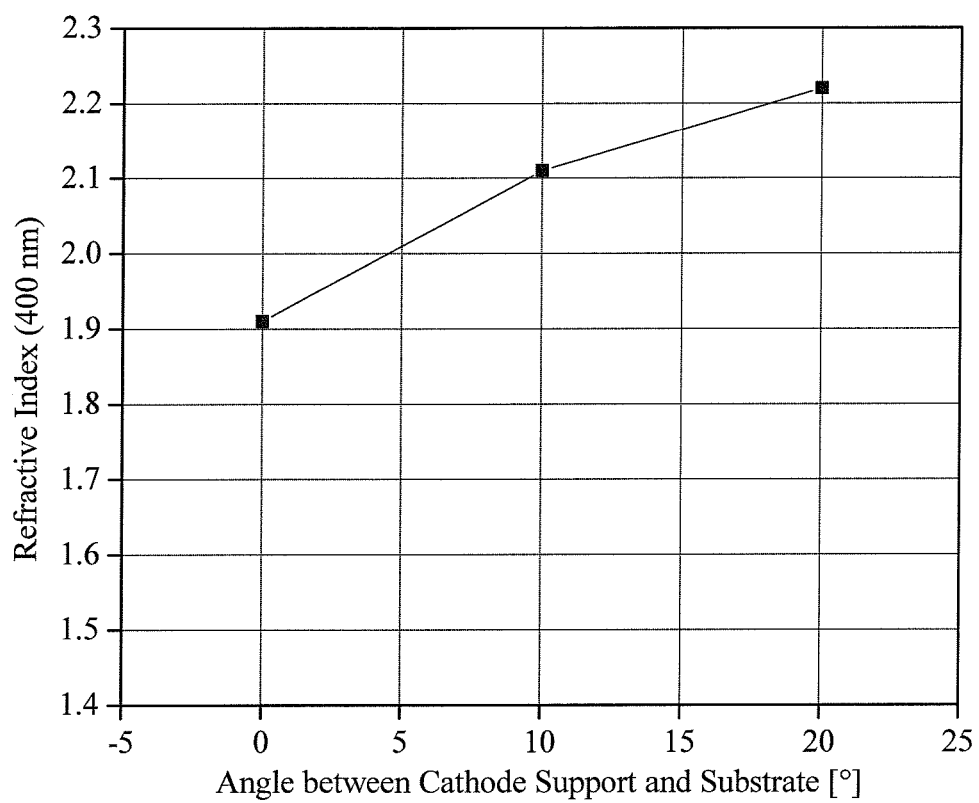
FIG. 4 is a plot of refractive index against angle between the cathode support and the substrate for deposited layers composed of a mixture of $SiO_2$ and $Ta_2O_5$.
Figure 5:
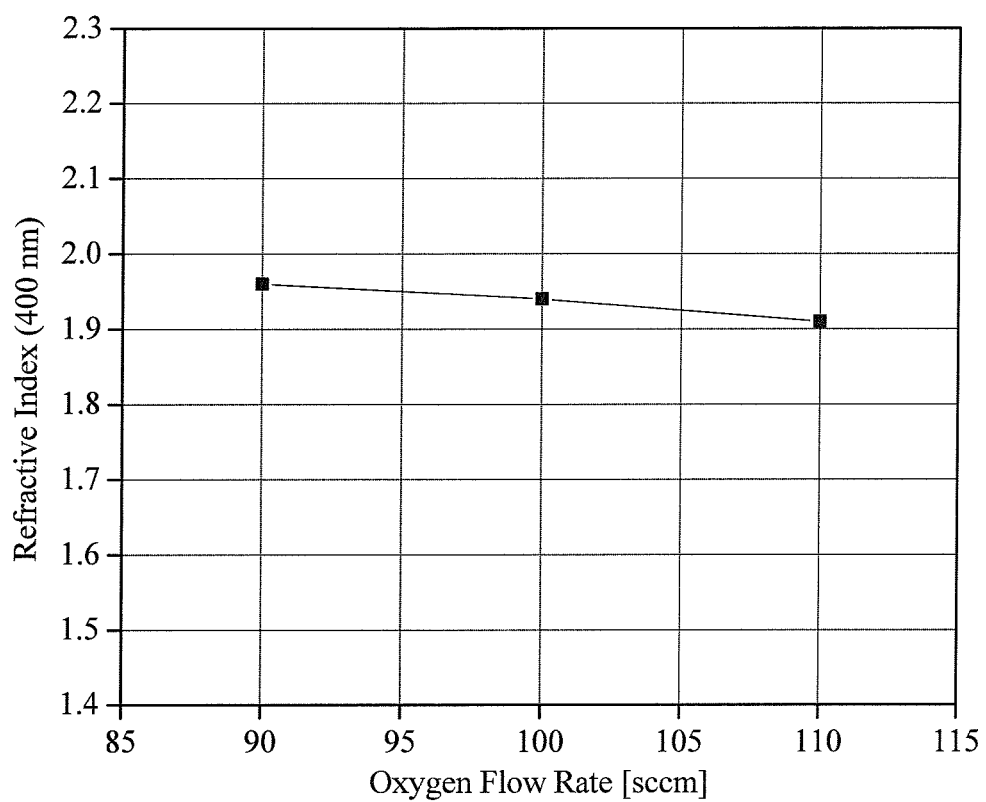
FIG. 5 is a plot of refractive index against oxygen flow rate for deposited layers composed of a mixture of $SiO_2$ and $Ta_2O_5$.

In a preferred embodiment, a dependence relationship of refractive index on the operating parameter, such as those plotted in FIGS. 3-5, is provided, and the operating parameter is adjusted in accordance with this dependence relationship, such that the layer has a predetermined refractive index. Preferably, the reference value or the sequence of reference values of the operating parameter required to achieve the predetermined refractive index or the sequence of predetermined refractive indices are determined on the basis of the dependence relationship.

Alternatively, the refractive index of the deposited layer can be monitored using an ellipsometer, and the reference value of the operating parameter can be determined through a control loop to yield the predetermined refractive index.

Of course, numerous other embodiments may be envisaged without departing from the spirit and scope of the invention.

We claim:

1. A method for depositing a layer composed of a mixture of materials and having a plurality of compositions and a plurality of predetermined composite refractive indices, in a sputter-deposition system, comprising:
   providing a vacuum chamber;
   providing a single DC power supply;
   providing a substrate disposed on a substrate support in the vacuum chamber;
   providing a plurality of target cathodes in the vacuum chamber, wherein each target cathode comprises a target material having a different composition, and wherein the plurality of target cathodes are separate from one another and are connected in parallel to a negative lead of the single DC power supply, such that the plurality of target cathodes are powered by only the single DC power supply;
   cosputtering the plurality of target cathodes to deposit the layer composed of a mixture of materials on the substrate by simultaneously applying a substantially identical cathode voltage to each target cathode throughout deposition of the layer, by means of the single DC power supply;
   moving the substrate support rotationally to uniformly expose the substrate to each target cathode during deposition of the layer; and
   adjusting a common operating parameter affecting all of the plurality of target cathodes to have a plurality of values during deposition of the layer, wherein the common operating parameter is cathode power, cathode voltage, cathode current, or a flow rate of a reactive gas introduced into the vacuum chamber, such that the relative amounts of materials applied from the plurality of target cathodes are affected so that the layer has a plurality of compositions and a plurality of predetermined composite refractive indices along a thickness of the layer.

2. The method of claim 1 wherein the common operating parameter is cathode power, cathode voltage, or cathode current.

3. The method of claim 1 further comprising introducing a reactive gas into the vacuum chamber, wherein the common operating parameter is a flow rate of the reactive gas.

4. The method of claim 1 further comprising introducing a reactive gas into the vacuum chamber, wherein the reactive gas is oxygen, and wherein the plurality of target cathodes consist of one target cathode comprising tantalum and one target cathode comprising silicon.

5. A method for depositing a plurality of layers composed of a mixture of materials and having a plurality of compositions and a plurality of predetermined composite refractive indices in a sputter-deposition system, comprising:
   providing a vacuum chamber;
   providing a single DC power supply;
   providing a plurality of target cathodes in the vacuum chamber, wherein each target cathode comprises a target material having a different composition, and wherein the plurality of target cathodes are separate from one another and are connected in parallel to a negative lead of the single DC power supply, such that the plurality of target cathodes are powered by only the single DC power supply;
   providing a first substrate disposed on a substrate support in the vacuum chamber;
   cosputtering the plurality of target cathodes to deposit a first layer composed of a mixture of materials on the first substrate by simultaneously applying a substantially identical cathode voltage to each target cathode throughout deposition of the first layer, by means of the single DC power supply;
   moving the substrate support rotationally to uniformly expose the first substrate to each target cathode during deposition of the first layer;
   adjusting a common operating parameter affecting all of the plurality of target cathodes to have a substantially constant first value during deposition of the first layer, wherein the common operating parameter is cathode power, cathode voltage, cathode current, or a flow rate of a reactive gas introduced into the vacuum chamber, such that the relative amounts of materials applied from the plurality of target cathodes are affected so that the first layer has a first composition and a first predetermined composite refractive index;

providing a second substrate disposed on the substrate support in the vacuum chamber;

cosputtering the plurality of target cathodes to deposit a second layer composed of a mixture of materials on the second substrate by simultaneously applying a substantially identical cathode voltage to each target cathode throughout deposition of the second layer, by means of the single DC power supply;

moving the substrate support rotationally to uniformly expose the second substrate to each target cathode during deposition of the second layer; and adjusting the common operating parameter to have a substantially constant second value different from the first value during deposition of the second layer, such that the relative amounts of materials applied from the plurality of target cathodes are affected so that the second layer has a second composition different from the first composition and a second predetermined composite refractive index different from the first predetermined composite refractive index.

6. The method of claim 1 wherein the common operating parameter is adjusted to have a plurality of continuous values during deposition of the layer, such that the layer has a plurality of compositions and a plurality of predetermined composite refractive indices that vary continuously along the thickness of the layer.

* * * * *